(12) United States Patent
Miyatake

(10) Patent No.: US 7,298,661 B2
(45) Date of Patent: Nov. 20, 2007

(54) SEMICONDUCTOR MEMORY DEVICE

(75) Inventor: Hisatada Miyatake, Ohlsu (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/460,299

(22) Filed: Jul. 27, 2006

(65) Prior Publication Data

US 2007/0053235 A1   Mar. 8, 2007

(51) Int. Cl.
*G11C 7/00*   (2006.01)

(52) U.S. Cl. ...................... 365/222; 365/149

(58) Field of Classification Search ........... 365/222, 365/149, 230.01
See application file for complete search history.

(56) References Cited

U.S. PATENT DOCUMENTS

| | | | |
|---|---|---|---|
| 5,619,470 A * | 4/1997 | Fukumoto ............... | 365/228 |
| 6,449,685 B1 * | 9/2002 | Leung ...................... | 711/106 |
| 2006/0039220 A1 * | 2/2006 | Takahashi et al. ....... | 365/222 |

FOREIGN PATENT DOCUMENTS

| | | |
|---|---|---|
| JP | 2003-187575 | 7/2003 |
| JP | 2004-319053 | 11/2004 |

* cited by examiner

*Primary Examiner*—Vu A. Le
(74) *Attorney, Agent, or Firm*—W. Riyon Harding (57) ABSTRACT

Pseudo SRAM capable of arbitrating refresh requests with external access requests is provided. An access waiting circuit 20 for generating an access waiting signal /ECP in response to an external access request signal /CE or the like, an access activating circuit 21 for generating an access activating signal /AE in response to L level of the access waiting signal /ECP and H level of a busy signal /BUSY, a refresh waiting circuit 22 for generating a refresh waiting signal /REFP in response to a refresh request signal /REFT, and a refresh activating circuit 23 for generating a refresh activating signal /REFE in response to H level of the access waiting signal /ECP, L level of the refresh waiting signal /REFP, and H level of the busy signal /BUSY are provided. An array control circuit 12 performs an access operation in response to the access activating signal /AE, and performs the refresh operation in response to the refresh activating signal /REFE.

13 Claims, 8 Drawing Sheets

SEMICONDUCTOR MEMORY DEVICE

CROSS REFERENCE TO RELATED PUBLICATIONS

This patent application claims priority to Japanese Patent Application No. 2005-254878 filed Sep. 2, 2005.

FIELD OF THE INVENTION

The present invention relates to a semiconductor memory device, and more specifically, it relates to pseudo SRAM (PSRAM; Pseudo Static Random Accesses Memory) and DRAM (Dynamic Random Accesses Memory), both of which require refresh operations.

BACKGROUND OF THE INVENTION

Conventionally, SRAM (Static Random Accesses Memory) and DRAM have been widely used as rewritable semiconductor memory devices.

SRAM uses static memory cells and a static memory cell usually consists of six transistors. Since static memory cells have driving capability and restoring capability, SRAM is mainly used for high-speed applications.

On the other hand, DRAM uses dynamic memory cells and a dynamic memory cell usually consists of one transistor and one capacitor. Since dynamic memory cells are small in size, DRAM is mainly used for applications that require large memory capacity. However, since dynamic memory cells have neither driving capability nor restoring capability, DRAMs need to perform refresh operations to read data and write the same data back within a specified refresh period in order to prevent memory loss due to leakage current and so forth.

In order to simplify the control of refresh operations, DRAMs having a self-refresh function have also been provided. DRAMs of this type have therein a refresh timer for measuring time against a predetermined time, and a refresh address counter for sequentially and internally generating addresses to be refreshed. DRAMs of this type enter into a self-refresh mode in response to an instruction supplied externally, and in that mode automatically perform refresh operations. Hence, it is an external memory controller that controls the refresh operations so that they may not compete with normal access operations.

In portable devices as represented by cell phones, SRAMs have been used in many cases since SRAMs can be easily used and the memory capacity required is not so large. In recent years, however, in order to support a utilization mode that requires a large amount of data, such as images, pseudo SRAMs have been increasingly used. Pseudo SRAMs are semiconductor memory devices, which use the same dynamic memory cells as those of DRAMs, and for which external interfaces and control methods from external devices are the same or almost the same as those of SRAMs, and Pseudo SRAM is referred to also as VSRAM (Virtual Static Random Accesses Memory).

Pseudo SRAMs require refresh operations, but in general they are constructed such that refresh instructions from external devices are not required. In this case, since refresh operations may possibly compete with normal read operations or write operations, refresh operations need to be controlled so that refresh operations may not prevent read instructions or write instructions sent from external devices. That is, pseudo SRAMs need to appropriately perform generation of a refresh activating signal and control of a refresh address counter, and so forth, which are required for internal refresh operations, while arbitrating the refresh operations with external accesses.

As one method of implementing such control, Japanese Unexamined Patent Publication (Kokai) No. 2003-187575 discloses a refresh control method of semiconductor memory device. According to this method, the number of occurrences of requests of starting refresh operations is monitored during the operation period of external access operations executed preferentially to refresh operations, and internal operations for refresh operations are controlled according to the number of occurrences. According to this method, refresh operations are prohibited during execution of external accesses. For this period, internal operations for the refresh operation for the first request of starting refresh operations are controlled, but internal operations for the second and subsequent requests for starting refresh operations is prohibited. Even if a plurality of requestsfor starting refresh operations are submitted while external access operations are being performed.

As another implementation method, Japanese Unexamined Patent Publication (Kokai) No. 2004-319053 discloses a semiconductor memory device in which long cycle limits can be relaxed. This semiconductor memory device is provided with a refresh controller for executing refresh operations. The refresh controller is provided with a refresh timing signal generating unit, a refresh request signal generating unit, and a refresh execution signal generating unit. The refresh request signal generating unit is provided with a first counter for counting the number of occurrences of the refresh timing signal, and a second counter for counting the number of occurrences of the refresh execution signal, and generates refresh request signal when the difference between two numbers of occurrences is one or more. When the difference is two or more, the refresh execution signal generating unit can generate the refresh execution signal two times or more during one cycle of the refresh timing signal.

In any of the aforementioned methods, the control is complicated, and thus the circuits are complicated. Moreover, in any of the methods, since operations are controlled only by arbitration between external accesses and internally generated refresh requests, refresh cannot be performed immediately when refresh becomes possible. For that reason, efficiency of refresh is low. This is a bar to maximizing efficiency of external accesses in applications in which data transmission speeds are maximized.

SUMMARY OF THE INVENTION

It is an object of the present invention to provide a semiconductor memory device capable of arbitrating refresh requests and external access requests.

A semiconductor memory device in accordance with the present invention is provided with at least one memory cell array, an array control circuit, an access control circuit, and a refresh control circuit. The memory cell array includes dynamic memory cells. The array control circuit accesses the memory cell array or arrays according to an external address signal, and refreshes the memory cell array according to a refresh address signal. The access control circuit allows the access by the array control circuit, in the case where an access is externally requested and when the array control circuit is not in operation. The refresh control circuit allows the refresh by the array control circuit, in the case where a refresh is requested and when the access is not externally requested and the array control circuit is not in operation.

In this semiconductor memory device, when an external access is requested, and if the array control circuit itself is not in operation, the array control circuit accesses the memory cell array according to the external address signal. On the other hand, when the refresh is requested, and if the external access is not requested and the array control circuit itself is not in operation, the array control circuit refreshes the memory cell array according to the refresh address signal. In this manner, the semiconductor memory device can arbitrate between the external access request and the refresh request.

Preferably, the array control circuit generates a busy signal during the access operation or the refresh operation for the memory cell array. The access control circuit includes an access waiting circuit. The access waiting circuit generates an access waiting signal in response to an access request signal externally supplied. The refresh control circuit includes a refresh waiting circuit and a refresh activating circuit. The refresh waiting circuit generates a refresh waiting signal in response to a refresh request signal. The refresh activating circuit generates a refresh activating signal in response to inactive state of the access waiting signal, active state of the refresh waiting signal, and inactive state of the busy signal. The array control circuit performs the refresh operation in response to the refresh activating signal.

In this case, the refresh is immediately performed while giving priority to the external access, based on the states of the busy signal indicating that the array control circuit is in operation, the access waiting signal indicating that the external access is requested, and the refresh waiting signal indicating that the refresh is requested, and thus the efficiency of the external access and the refresh can be increased.

Preferably, the semiconductor memory device includes an address counter. The address counter generates the refresh address signal in response to the refresh activating signal.

In this case, the control of the address counter becomes simple, compared with the previously described prior art.

Preferably, the semiconductor memory device includes a refresh timer. The refresh timer generates the refresh request signal.

In this case, the semiconductor memory device may function as pseudo SRAM, since it is not necessary to externally supply either the refresh request or the refresh address signal.

Preferably, the refresh timer keeps activating the refresh request signal until the address counter finishes continuously generating a predetermined number of refresh address signals.

In this case, the array control circuit performs burst refresh, and if the external access is requested during burst refresh, it can interrupt the burst refresh to give priority to the external access request.

A refresh control method, according to the present invention, in a semiconductor memory device provided with at least one memory cell array including dynamic memory cells, includes the steps of: generating a busy signal during the access operation or the refresh operation for the memory cell array; generating an access waiting signal in response to an externally supplied access request signal; generating a refresh waiting signal in response to a refresh request signal; generating a refresh activating signal when the access waiting signal is in the inactive state the refresh waiting signal is in the active state, and the busy signal is in the inactive state; and performing the refresh operation in response to the refresh activating signal.

According to the refresh control method, the refresh is immediately performed while giving priority to the external access, based on the states of the busy signal for indicating that the array control circuit is in operation, the access waiting signal for indicating that the external access is requested, and the refresh waiting signal for indicating that the refresh is requested. Thus the efficiency of the external access and the refresh can be increased.

DETAILED DESCRIPTION OF THE INVENTION

Hereafter, preferred embodiments of the present invention will be described in detail, referring to the drawings. The same reference numerals are given to the same or corresponding parts throughout the drawings, and the description will not be repeated. It should be noted that a symbol of "/" (slash) attached in front of a signal indicates that the signal is active at a logic low level. Hereafter, a logic low will be described as "L", and a logic high will be described as "H".

FIRST EMBODIMENT

Figure 1:
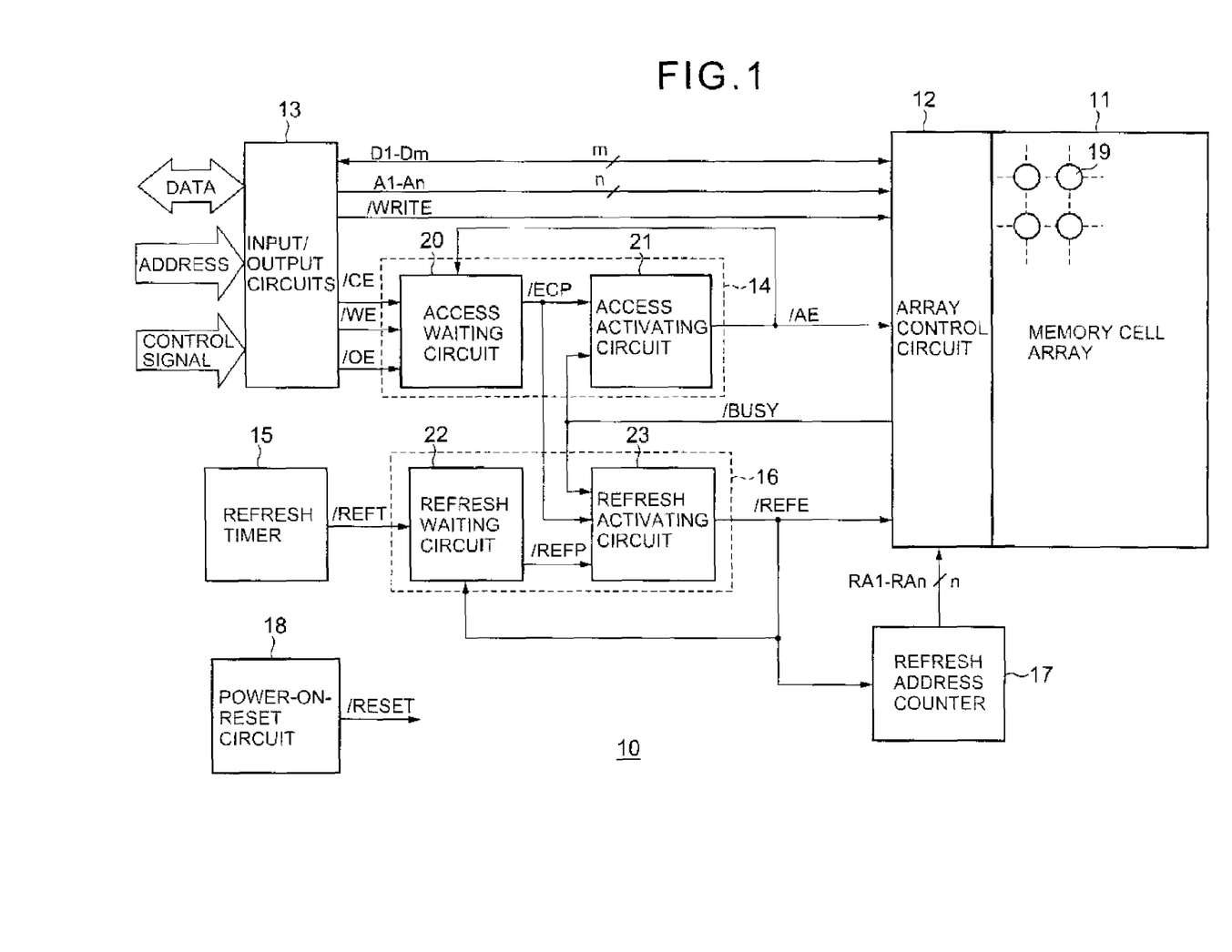
FIG. 1 is a functional block diagram illustrating a configuration of pseudo SRAM according to a first embodiment of the present invention.

Referring to FIG. 1, pseudo SRAM 10 according to a first embodiment of the present invention includes a memory cell array 11, an array control circuit 12, input/output circuits 13, an access control circuit 14, a refresh timer 15, a refresh control circuit 16, a refresh address counter 17, and a power-on reset circuit 18.

The memory cell array 11 includes a plurality of dynamic memory cells 19 arranged in matrix form. Each dynamic memory cell 19 consists of a transistor (not shown) and a capacitor (not shown), and stores 1 bit data by charging electric charge in the capacitor. The memory cell array 11 further includes a plurality of word lines (not shown) arranged in rows, and a plurality of bit line pairs (not shown) arranged in columns. The dynamic memory cells 19 are arranged at positions corresponding to intersections of word lines and bit line pairs.

The array control circuit 12 accesses the memory cell array 11 according to external address signal A1-An of n bit, which are externally supplied. Specifically, the array control circuit 12 writes data D1-Dm in the memory cell array 11, and reads data D1-Dm from the memory cell array 11. The array control circuit 12 also refreshes the memory cell array 11 according to refresh address signal RA1-RAn of n bit supplied from the refresh address counter 17. Specifically, the array control circuit 12 reads data from the memory cell array 11, and writes the same data in the memory cell array 11 back. The array control circuit 12 also generates a busy signal /BUSY during its operation.

The array control circuit 12 is not illustrated with figures here because it has a well-known configuration, but specifically, it consists of predecoders, row decoders, column decoders, column selecting gates, sense amplifiers, control circuits for the decoders and the sense amplifiers, and so on.

The input/output circuits 13 perform input and output of data D1-Dm, input of external address signals A1-An, and input of control signals, and so on. The control signals include access request signals, such as a chip enable signal /CE, a write enable signal /WE, and an output enable signal /OE.

The access control circuit 14 enables the array control circuit 12 to access to the memory cell array 11, in the case where an access is externally requested and when the array control circuit 12 is not in operation. The access control circuit 14 includes an access waiting circuit 20 for keeping an externally requested access waiting, and an access activating circuit 21 for activating access operations of the array control circuit 12. The access waiting circuit 20 generates an access waiting signal /ECP in response to the chip enable signal /CE, the write enable signal /WE, or the output enable signal /OE. The access activating circuit 21 generates an access activating signal /AE in response to active state (L level) of the access waiting signal /ECP, and inactive state (H level) of the busy signal /BUSY. The array control circuit 12 performs access operations in response to the access activating signal /AE.

The refresh timer 15 requests refreshes to the refresh control circuit 16. Specifically, the refresh timer 15 generates a refresh request signal /REFT at a specified refresh period.

The refresh control circuit 16 enables the array control circuit 12 to refresh the memory cell array 11, in the case where the refresh is requested and when the access is not externally requested and the array control circuit 12 is not in operation. The refresh control circuit 16 includes a refresh waiting circuit 22 for keeping the refresh requested by the refresh timer 15 waiting, and a refresh activating circuit 23 for activating refresh operations of the array control circuit 12. The refresh waiting circuit 22 generates a refresh waiting signal /REFP in response to the refresh request signal /REFT. The refresh activating circuit 23 generates a refresh activating signal /REFE in response to inactive state (H level) of the access waiting signal /ECP, active state (L level) of the refresh waiting signal /REFP, and inactive state (H level) of the busy signal /BUSY. The array control circuit 12 performs refresh operations in response to the refresh activating signal /REFE.

The refresh address counter 17 generates refresh address signal RA1-RAn, when the refresh control circuit 16 enables the refresh, i.e., in response to the refresh activating signal /REFE.

The power-on reset circuit 18 generates a power-on reset signal /RESET immediately after the power is turned on. The power-on reset signal /RESET is supplied to the access waiting circuit 20, the access activating circuit 21, the refresh waiting circuit 22, the refresh activating circuit 23, and so on.

Figure 2:
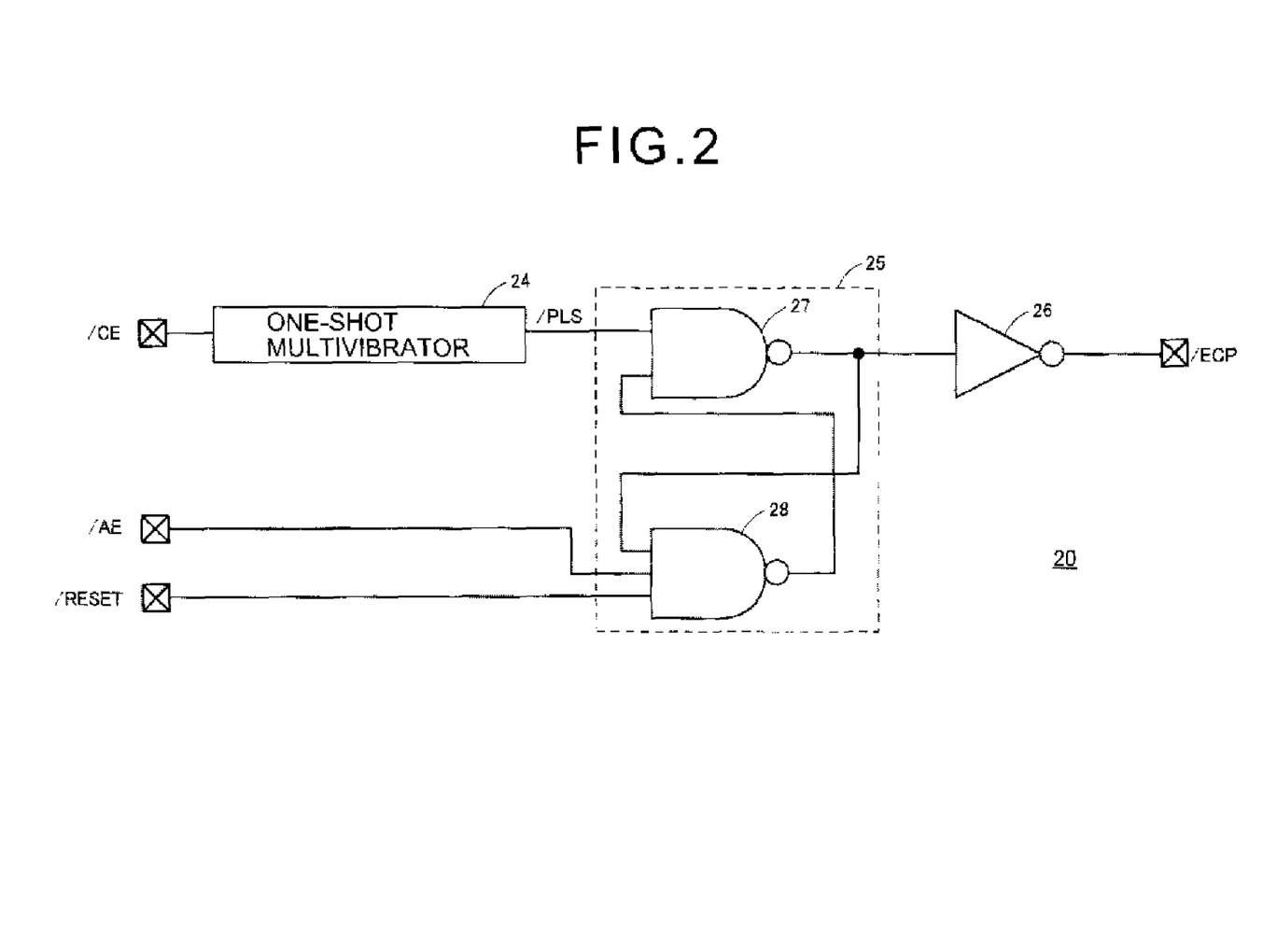
FIG. 2 is a circuit diagram illustrating the configuration of the access waiting circuit in FIG. 1.

Referring to FIG. 2, the access waiting circuit 20 includes a one-shot multivibrator 24, an RS flip-flop circuit 25, and an inverter 26. The RS flip-flop circuit 25 includes NAND circuits 27 and 28. The one-shot multivibrator 24 generates a pulse signal /PLS with a specified width by using a falling edge of the chip enable signal /CE as a trigger. The RS flip-flop circuit 25 is set when the pulse signal /PLS is at L level, and is reset when the access activating signal /AE is at L level. The RS flip-flop circuit 25 is also reset when the power-on reset signal /RESET is at L level. When the RS flip-flop circuit 25 is set, the access waiting signal /ECP becomes L level, and when the RS flip-flop circuit 25 is reset, the access waiting signal /ECP becomes H level.

Figure 3:
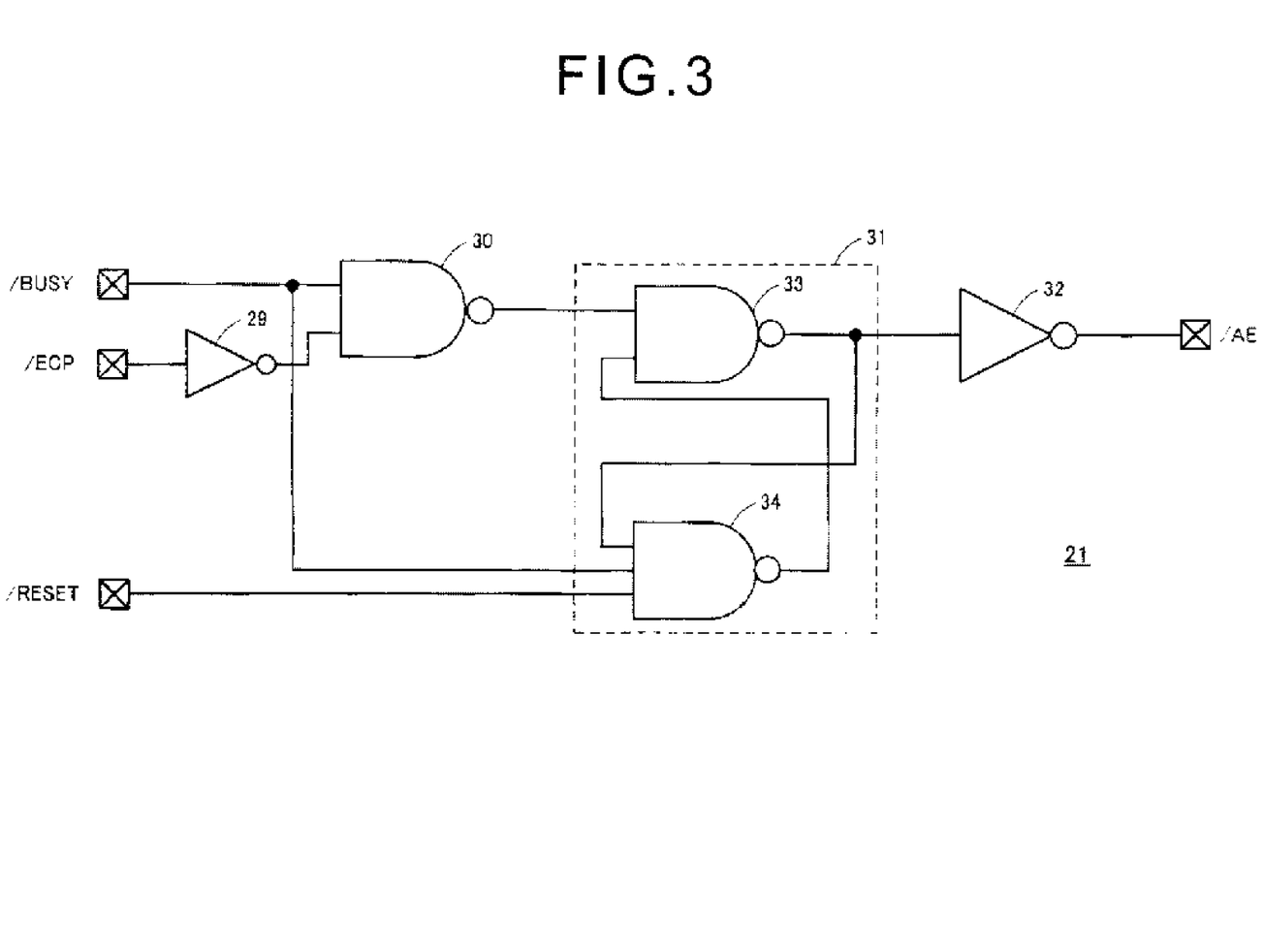
FIG. 3 is a circuit diagram illustrating the configuration of the access activating circuit in FIG. 1.

Referring to FIG. 3, the access activating circuit 21 includes an inverter 29, a NAND circuit 30, an RS flip-flop circuit 31, and an inverter 32. The RS flip-flop circuit 31 includes NAND circuits 33 and 34. The RS flip-flop circuit 31 is set when the busy signal /BUSY is at H level and the access waiting signal /ECP is at L level, and is reset when the busy signal /BUSY is at L level. The RS flip-flop circuit 31 is also reset when the power-on reset signal /RESET is at L level. When the RS flip-flop circuit 31 is set, the access activating signal /AE becomes L level, and when the RS flip-flop circuit 31 is reset, the access activating signal /AE becomes H level.

Figure 4:
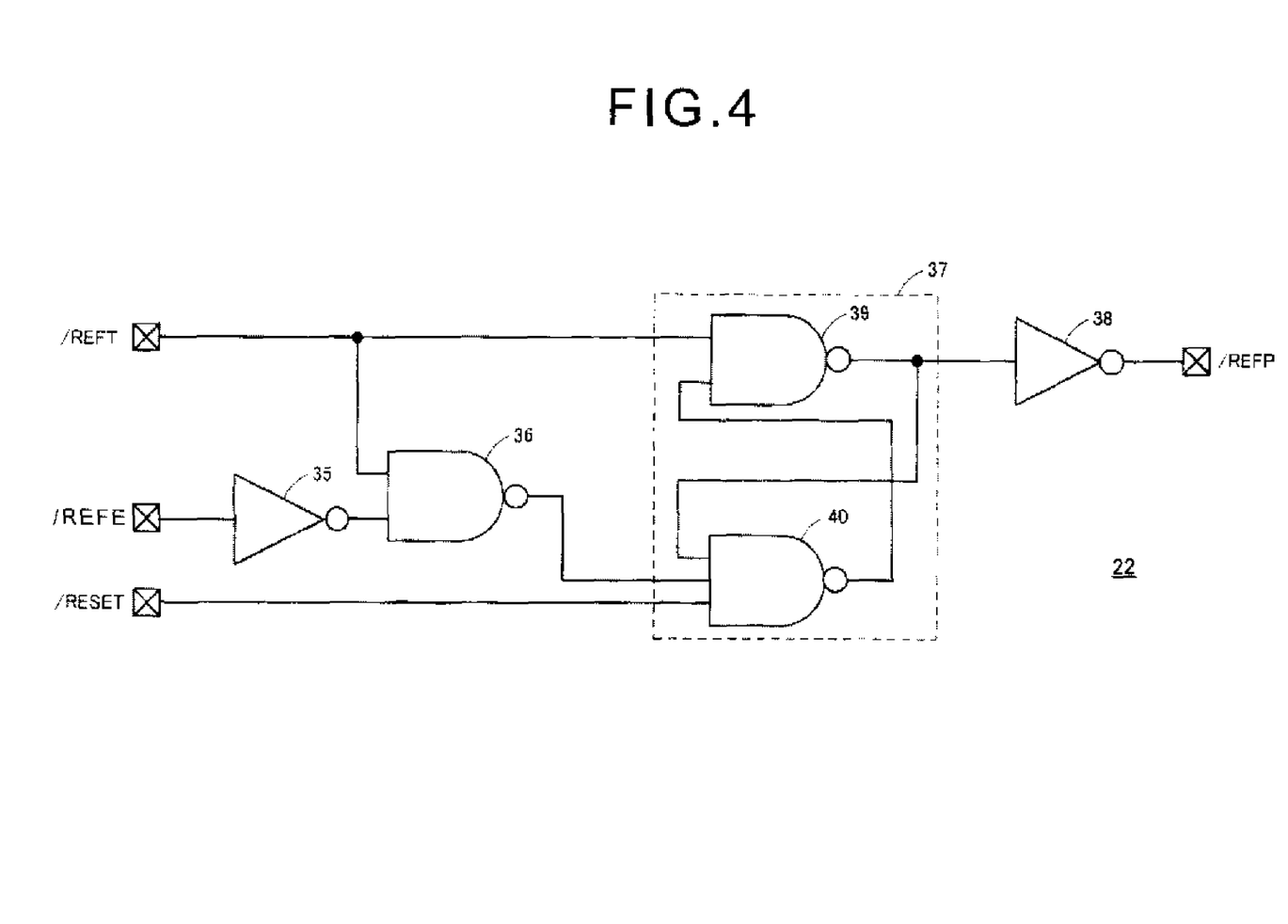
FIG. 4 is a circuit diagram illustrating the configuration of the refresh waiting circuit in FIG. 1.

Referring to FIG. 4, the refresh waiting circuit 22 includes an inverter 35, a NAND circuit 36, an RS flip-flop circuit 37, and an inverter 38. The RS flip-flop circuit 37 includes NAND circuits 39 and 40. The RS flip-flop circuit 37 is set when the refresh request signal /REFT is at L level, and is reset when the refresh request signal /REFT is at H level and the refresh activating signal /REFE is at L level. The RS flip-flop circuit 37 is also reset when the power-on reset signal /RESET is at L level. When the RS flip-flop circuit 37 is set, the refresh waiting signal /REFP becomes L level, and when the RS flip-flop circuit 37 is reset, the refresh waiting signal /REFP becomes H level.

Figure 5:
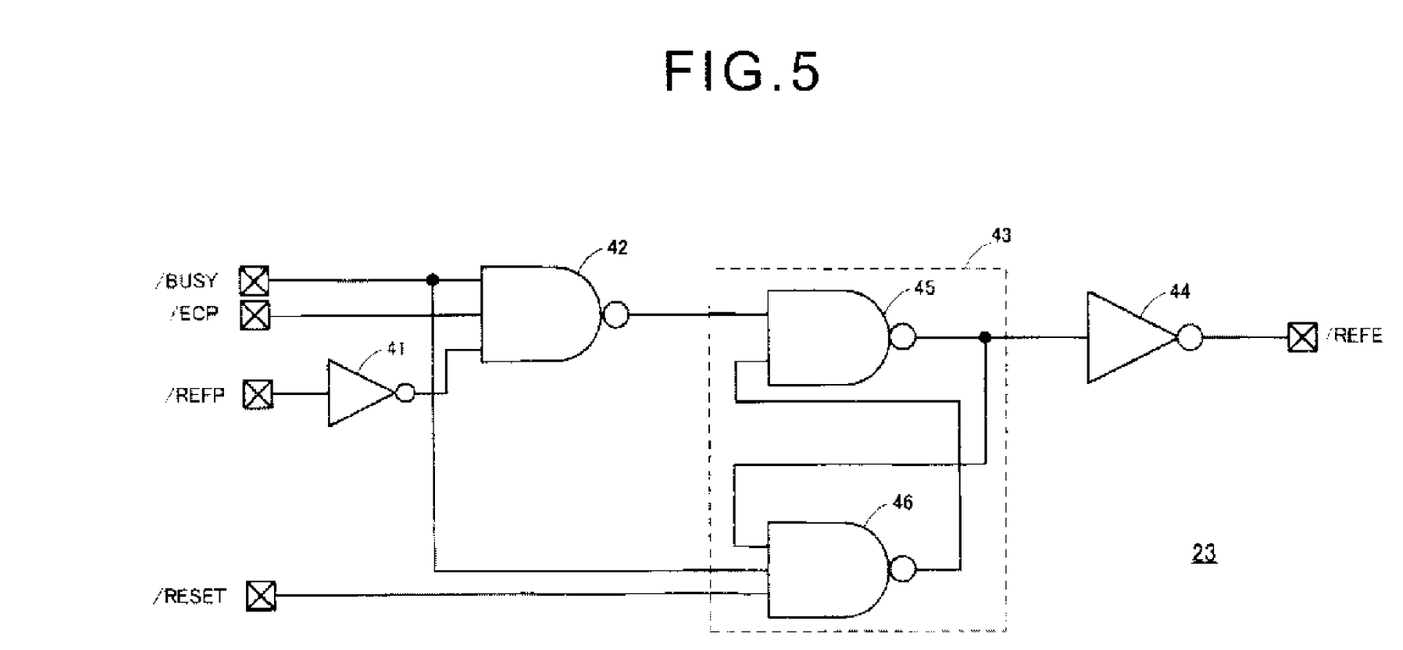
FIG. 5 is a circuit diagram illustrating the configuration of the refresh activating circuit in FIG. 1.

Referring to FIG. 5, the refresh activating circuit 23 includes an inverter 41, a NAND circuit 42, an RS flip-flop circuit 43, and an inverter 44. The RS flip-flop circuit 43 includes NAND circuits 45 and 46. The RS flip-flop circuit 43 is set when the busy signal /BUSY is at H level, the access waiting signal /ECP is at H level, and the refresh waiting signal /REFP is at L level, and is reset when the busy signal /BUSY is at L level. The RS flip-flop circuit 43 is also reset when the power-on reset signal /RESET is at L level. When the RS flip-flop circuit 43 is set, the refresh activating signal /REFE becomes L level, and when the RS flip-flop circuit 43 is reset, the refresh activating signal /REFE becomes H level.

Next, distributed refresh operations of the aforementioned pseudo SRAM 10 will be described.

Figure 6:
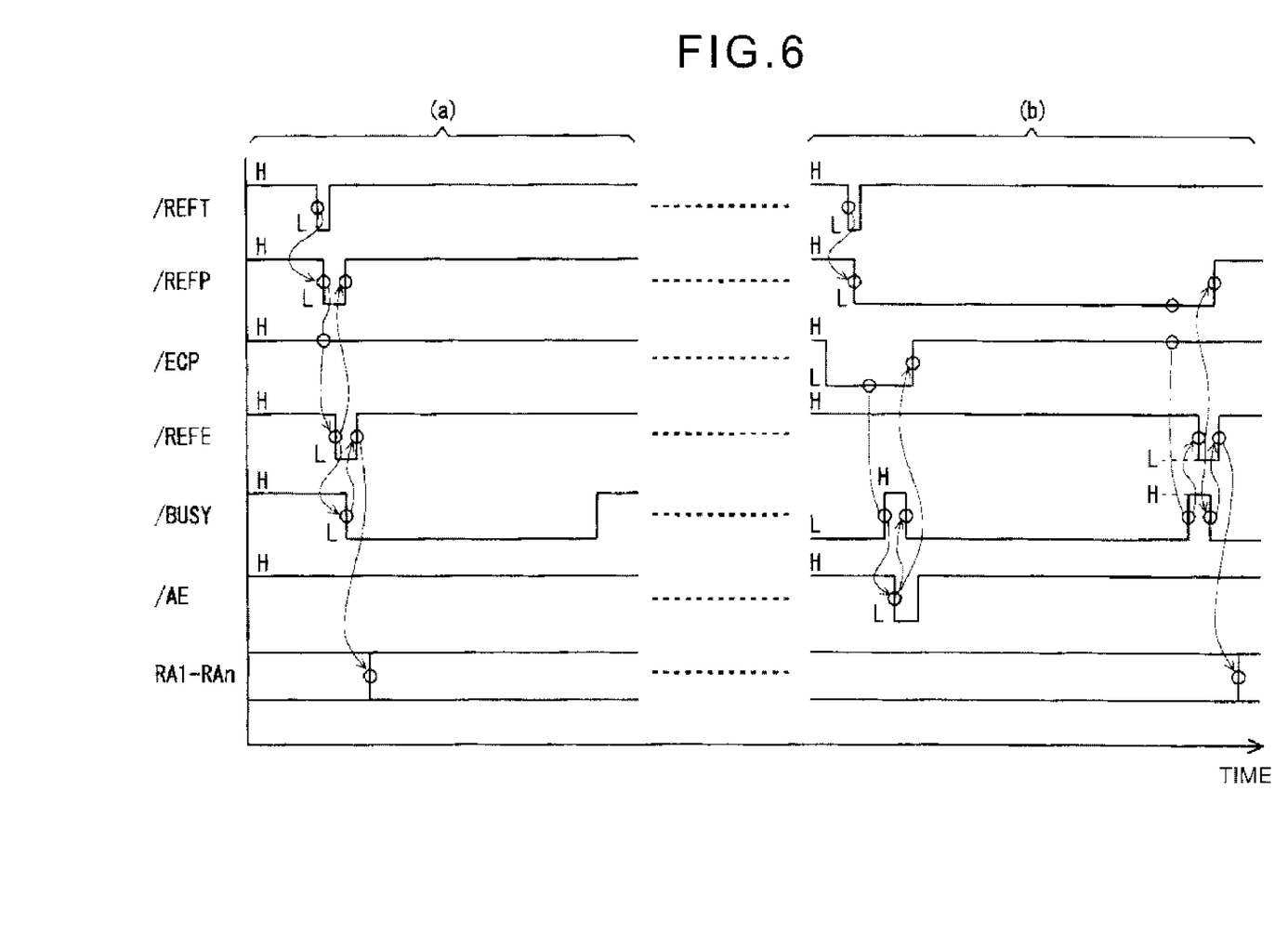
FIG. 6 is a timing chart illustrating distributed refresh operations of pseudo SRAM shown in FIG. 1.

Referring to FIG. 6, and in particular, part (a) of FIG. 6, when the refresh timer 15 brings the refresh request signal /REFT to L level, the refresh waiting circuit 22 brings the refresh waiting signal /REFP to L level. In the case where the busy signal /BUSY is at H level and the access waiting signal /ECP is at H level, when the refresh waiting signal /REFP is set to L level, the refresh activating circuit 23 brings the refresh activating signal /REFE to L level.

When the refresh activating signal /REFE is set to L level, the refresh waiting circuit 22 resets the refresh waiting signal /REFP to H level, and the array control circuit 12 takes in and holds the refresh address signal RA1-RAn currently outputted from the refresh address counter 17, to thereby refresh the memory cell array 11 according to the refresh address signal RA1-RAn, and also brings the busy signal /BUSY to L level. When the busy signal /BUSY is set to L level, the refresh activating circuit 23 resets the refresh activating signal /REFE to H level.

When the refresh activating signal /REFE is set to H level, the refresh address counter 17 updates and holds the refresh address signal RA1-RAn in preparation for the next refresh cycle. When the refresh is completed, the array control circuit 12 resets the busy signal /BUSY to H level.

While it is not shown, when the refresh activating signal /REFE is again set to L level at the next refresh cycle, the array control circuit 12 takes in and holds the refresh address signal RA1-RAn that the refresh address counter 17 is holding and outputting, to thereby refresh the memory cell array 11 according to the refresh address signal RA1-RAn.

Referring to part (b) of FIG. 6, differently from the above description, here, the access waiting circuit 20 brings the access waiting signal /ECP to L level in response to the chip enable signal /CE of L level, and the array control circuit 12 holds the busy signal /BUSY at L level.

During this period, when the refresh timer 15 brings the refresh request signal /REFT to L level, the refresh waiting circuit 22 brings the refresh waiting signal /REFP to L level in a manner similar to that described above. However, since the busy signal /BUSY and the access waiting signal /ECP are in L level, even if the refresh waiting signal /REFP is set to L level, the refresh activating circuit 23 does not bring the refresh activating signal /REFE to L level, but keeps it at H level.

Subsequently, when the busy signal /BUSY is reset to H level, the access activating circuit 21 brings the access activating signal /AE to L level. When the access activating signal /AE is set to L level, the access waiting circuit 20 resets the access waiting signal /ECP to H level, and the array control circuit 12 brings the busy signal /BUSY to L level.

After completing the access operations, the array control circuit 12 resets the busy signal /BUSY to H level. At this time, since the access waiting signal /ECP is at H level and the refresh waiting signal /REFP is at L level, the refresh activating circuit 23 brings the refresh activating signal /REFE to L level.

When the refresh activating signal /REFE is set to L level, the refresh waiting circuit 22 resets the refresh waiting signal /REFP to H level, and the array control circuit 12 brings the busy signal /BUSY to L level. When the busy signal /BUSY is set to L level, the refresh activating circuit 23 resets the refresh activating signal /REFE to H level.

The refresh address counter 17 generates the refresh address signal RA1-RAn in response to the refresh activating signal /REFE. The array control circuit 12 refreshes the memory cell array 11 according to the refresh address signal RA1-RAn.

In this manner, during the period after receiving the external access request and before the array control circuit 12 completes its operations, even if the refresh timer 15 requests the refresh, the refresh request is left pending, and the array control circuit 12 does not perform the refresh operations, but it performs the refresh operations immediately after completing the external access operations.

Incidentally, in this configuration, there is a possibility that the refresh operation may be kept waiting if the external access requests successively occur, but if the shortest external cycle time is set slightly longer than the internal cycle time, it is possible to securely perform the refresh operations within the specified refresh period. The shortest cycle time specified by the specification of the pseudo SRAM 10 is called the "shortest external cycle time". Additionally, the time for the access and the time for the refresh are almost the same, and this time is called "internal cycle time". Since the details thereof are disclosed in Japanese Patent Application No. 2003-365168, it is incorporated herein by reference.

As described above, according to the first embodiment of the present invention, when the chip enable signal /CE is set to L level and the external access is requested, and if the array control circuit itself is not in operation, the array control circuit 12 accesses the memory cell array 11 according to the external address signal A1-An. On the other hand, when the refresh timer 15 brings the refresh request signal /REFT to L level to request the refresh, and if the external access is not requested and the array control circuit itself is not in operation, the array control circuit 12 refreshes the memory cell array 11 according to the refresh address signal RA1-RAn. The pseudo SRAM 10 can arbitrate between the external access request and the refresh request in a manner described above.

Moreover, by monitoring three kinds of signals, such as the busy signal /BUSY, the access waiting signal /ECP, and the refresh waiting signal /REFP, operations are quickly changed in the priority order of (1) the operation currently being executed, (2) the external access operation, (3) the refresh operation, while the operations are arbitrated, so the efficiency of the external access and the refresh can be increased. Namely, the access activating circuit 21 and the array control circuit 12 perform a handshake, and the refresh activating circuit 23 and the array control circuit 12 perform a handshake, thus making it possible to efficiently perform the external access operation and the refresh operation.

Specifically, the refresh operation is kept waiting while the external access is requested. In that case it is not necessary to perform a special control for the refresh address counter 17. In other words, the refresh address counter 17 is not controlled by the refresh request signal /REFT but controlled by the refresh activating signal /REFE. Moreover, if the array control circuit 12 is available to accept the next operation and the external access is not kept waiting, the refresh operation is immediately performed, so the time is not wasted, thus making it possible to support high speed data transfer.

Moreover, since the access activating signal /AE and the refresh activating signal /REFE are generated separately, the array control circuit 12 performs appropriate operations according to respective signals, thus allowing the power consumption to be suppressed. In other words, since it is not necessary to operate the circuits of the column system and the data system during the refresh operation, the power consumption in connection with the column system and the data system can be suppressed, by stopping the operations of the circuits of the column system and the data system when instructions of the refresh operation are inputted.

Moreover, it is sufficient to provide four kinds of comparatively simple logical circuits, such as the access waiting circuit 20, the access activating circuit 21, the refresh waiting circuit 22, and the refresh activating circuit 23, and it is not necessary to provide large-scale and complicated circuits, such as a counter for counting the number of occurrences of the refresh request, or a counter for counting the number of the refresh operations executed (employed in the prior art previously described). In other words, by dividing the refresh control into three stages of the refresh request, the refresh wait, and the refresh activation, it is possible to efficiently perform the whole control with a simpler configuration.

SECOND EMBODIMENT

Figure 7:
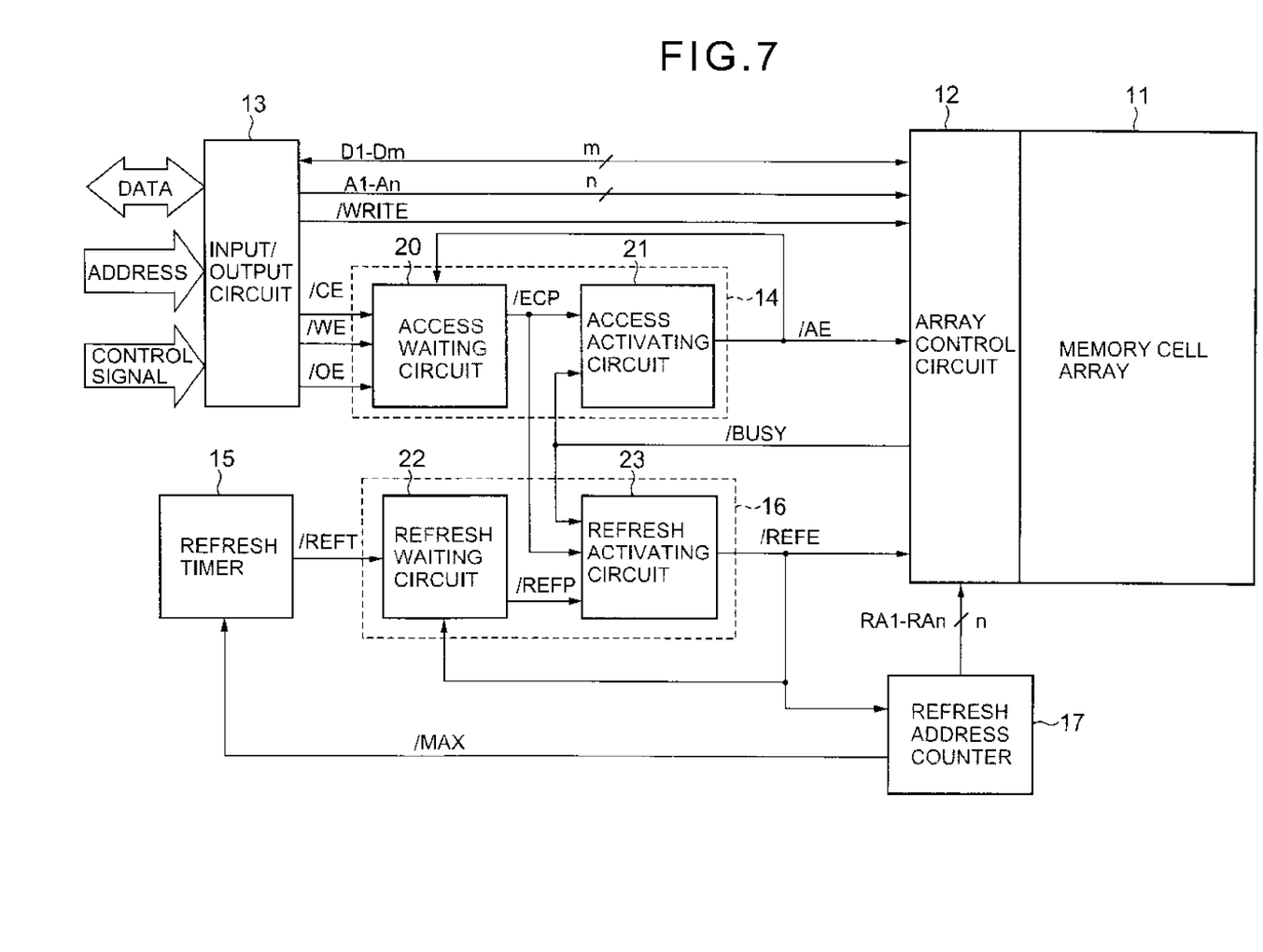
FIG. 7 is a functional block diagram illustrating the configuration of pseudo SRAM according to a second embodiment of the present invention.

Referring to FIG. 7, in the second embodiment of the present invention, unlike the aforementioned first embodiment, the refresh address counter 17 generates a refresh completion signal /MAX, when it finishes generating the last refresh address signal RA1-RAn. The refresh timer 15 keeps the refresh request signal /REFT at L level until the refresh completion signal /MAX is set to L level.

Next, burst refresh operation according to the second embodiment will be described.

Figure 8:
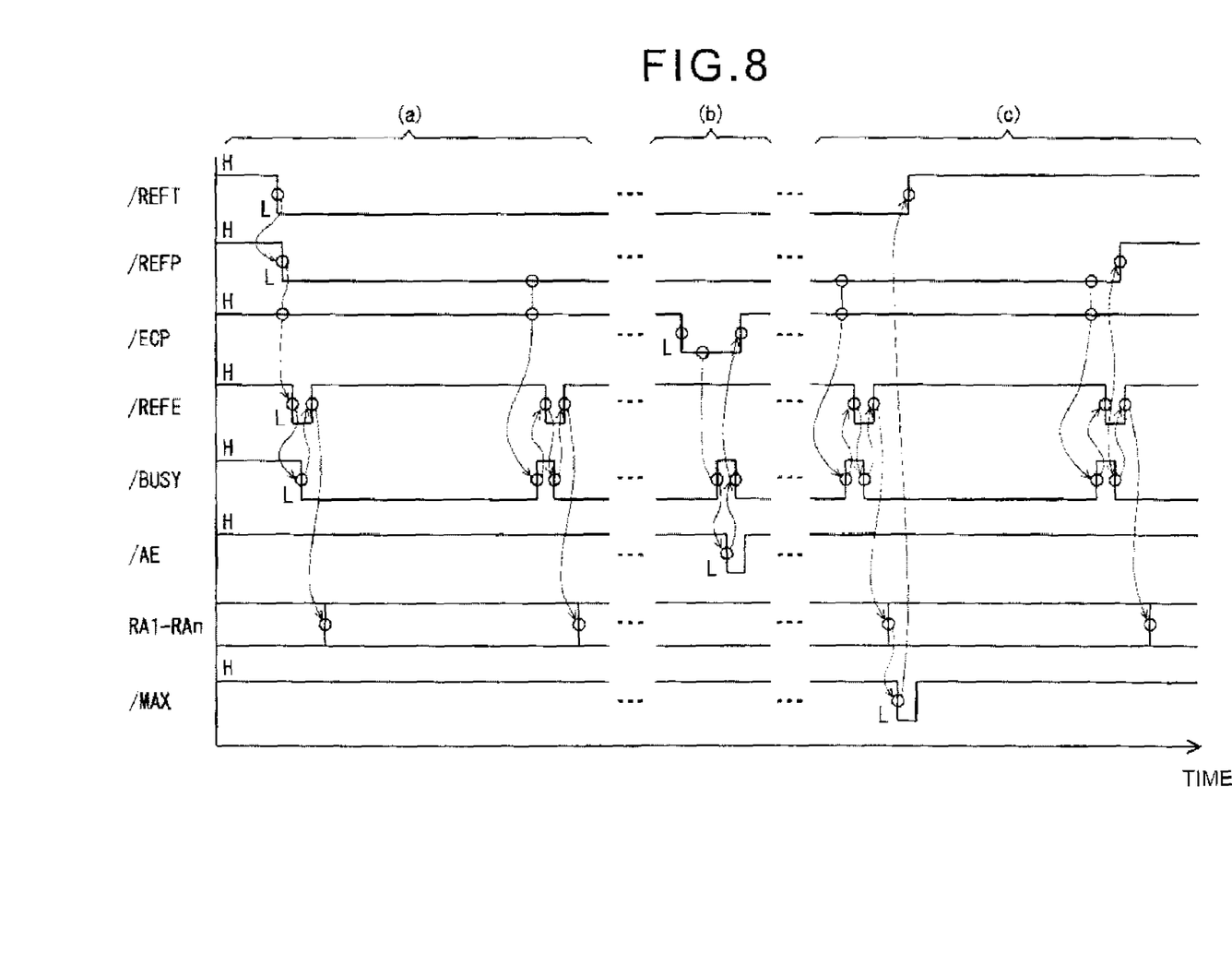
FIG. 8 is a timing chart illustrating burst refresh operations of pseudo SRAM shown in FIG. 7.

Referring to FIG. 8, and in particular, part (a) of FIG. 8, when the refresh timer 15 brings the refresh request signal /REFT to L level, the refresh waiting circuit 22 will bring the refresh waiting signal /REFP to L level. Unlike the aforementioned first embodiment, the refresh timer 15 keeps the refresh request signal /REFT at L level until the refresh completion signal /MAX is set to L level. Therefore, when the refresh activating signal /REFE is set to L level, the RS flip-flop circuit 37 of the refresh waiting circuit 22 is not reset. As a result, the refresh waiting circuit 22 keeps the refresh waiting signal /REFP at L level.

When the array control circuit 12 completes the refresh according to the first refresh address signal RA1-RAn, the array control circuit 12 resets the busy signal /BUSY to H level. At this time, since the access waiting signal /ECP is in H level, and the refresh waiting signal /REFP still stays at L level, the refresh activating circuit 23 brings the refresh activating signal /REFE to L level. Hence, the array control circuit 12 performs the refresh in response to the next refresh address signal RA1-RAn generated by the refresh address counter 17.

Referring to part (b) of FIG. 8, while the refresh waiting signal /REFP is kept at L level, namely, during the burst refresh, and when the chip enable signal /CE is set to L level and so that access is externally requested, the access waiting signal /ECP is brought to L level.

Subsequently, when the array control circuit 12 completes the refresh of the designated address and resets the busy signal /BUSY to H level, the access activating circuit 21 brings the access activating signal /AE to L level since the access waiting signal /ECP has been in L level. As a result, the array control circuit 12 performs the normal access operations.

Referring to part (c) of FIG. 8, the refresh address counter 17 generates the last refresh address signal RA1-RAn in preparation for the last refresh cycle, and further brings the refresh completion signal /MAX to L level. When the refresh completion signal /MAX is set to L level, the refresh timer 15 resets the refresh request signal /REFT to H level. Note herein that, since the refresh activating signal /REFE is in H level, the refresh waiting circuit 22 keeps the refresh waiting signal /REFP at L level.

Subsequently, when the array control circuit 12 completes the refresh of the second last address and resets the busy signal /BUSY to H level, the refresh activating circuit 23 brings the refresh activating signal /REFE to L level since the access waiting signal /ECP is in H level, and the refresh waiting signal /REFP still stays at L level. In response to this, the array control circuit 12 refreshes the memory cell array according to the last refresh address signal RA1-RAn generated in the previous refresh cycle.

At this time, since the refresh request signal /REFT has been reset to H level, the refresh waiting circuit 22 resets the refresh waiting signal /REFP to H level when the refresh activating signal /REFE is set to L level.

When the array control circuit 12 brings the busy signal /BUSY to L level and thus the refresh activating circuit 23 resets the refresh activating signal /REFE to H level, the refresh address counter 17 generates the first refresh address signal RA1-RAn for the next burst refresh in response to the rising edge of the refresh activating signal /REFE.

As described above, according to the second embodiment of the present invention, although the array control circuit 12 performs the burst refresh, it can interrupt the burst refresh to give priority to the external access request, if the external access is requested during the burst refresh.

The aforementioned embodiments are the pseudo SRAMs 10, which have the refresh timer 15 provided therein, but the refresh timer 15 may be omitted. In this case, the refresh request signal /REFT or a signal corresponding to this signal may be externally supplied. Moreover, the refresh address counter 17 may be omitted, either. The refresh address signals RA1-RAn are externally supplied in this case. The present invention is therefore applicable not only to pseudo SRAMs but also to DRAMs.

In the aforementioned embodiments, the access waiting circuit 20 for generating the access waiting signal /ECP in response to the chip enable signal /CE as an external access request signal, has been exemplified, but circuits for generating the access waiting signal in response to other external access request signals, such as the write enable signal /WE, the output enable signal /OE, and so on may be configured in a manner similar to the access waiting circuit 20.

As described above, the embodiments of the present invention have been described, but the aforementioned embodiments are only exemplifications for carrying out the present invention. Therefore, the present invention is not limited to the embodiments described above, and accordingly, the aforementioned embodiments can be appropriately modified and implemented without departing from the scope of the subject of the present invention.

The invention claimed is:

1. A semiconductor memory device, comprising:
    a memory cell array including a plurality of dynamic memory cells;
    an array control circuit for accessing the memory cell array in response to an external address signal, and refreshing the memory cell array in response to a refresh address signal;
    an access control circuit for allowing access by the array control circuit, if access is externally requested and the array control circuit is not in operation; and
    a refresh control circuit for allowing the refresh by the array control circuit, if a refresh is requested, access is not externally requested and the array control circuit is not in operation.

2. The semiconductor memory device according to claim 1, wherein
    the array control circuit generates a busy signal during an access operation or a refresh operation for the memory cell array;
    the access control circuit includes an access waiting circuit for generating an access waiting signal in response to an access request signal externally supplied;
    the refresh control circuit includes a refresh waiting circuit for generating a refresh waiting signal in response to a refresh request signal, and a refresh activating circuit for generating a refresh activating signal in response to the access waiting signal, the refresh waiting signal, and the busy signal; and the array control circuit performs the refresh operation in response to the refresh activating signal.

3. The semiconductor memory device according to claim 2, wherein the refresh waiting circuit includes a first flip-flop circuit which sets in response to the refresh request signal, and resets in response to the refresh activating signal.

4. The semiconductor memory device according to claim 3, further comprising a power-on reset circuit for generating a power-on reset signal immediately after power is turned on, the first flip-flop circuit being reset in response to active state of the power-on reset signal.

5. The semiconductor memory device according to claim 2, wherein the refresh activating circuit includes a second flip-flop circuit which sets in response to the access waiting signal, the refresh waiting signal, and the busy signal; and resets when the busy signal is active.

6. The semiconductor memory device according to claim 5, further comprising a power-on reset circuit for generating a power-on reset signal immediately after a power-on, the second flip-flop circuit being reset in response to active state of the power-on reset signal.

7. The semiconductor memory device according to claim 2, further comprising an address counter for generating the refresh address signal in response to the refresh activating signal.

8. The semiconductor memory device according to claim 7, further comprising a refresh timer for generating the refresh request signal.

9. The semiconductor memory device according to claim 8, wherein the refresh timer activates the refresh request signal until the address counter generates a predetermined number of refresh address signals.

10. A refresh control method in a semiconductor memory device comprising a memory cell array including a plurality of dynamic memory cells, the method comprising the steps of:
    generating a busy signal during an access operation or a refresh operation for the memory cell array;
    generating an access waiting signal in response to an access request signal externally supplied;
    generating a refresh waiting signal in response to a refresh request signal;
    generating a refresh activating signal in response to the inactive state of the access waiting signal, the active state of the refresh waiting signal, and the inactive state of the busy signal; and
    performing the refresh operation in response to the refresh activating signal.

11. The refresh control method in the semiconductor memory device according to claim 10, further comprising the step of generating a refresh address signal in response to the refresh activating signal.

12. The refresh control method in the semiconductor memory device according to claim 11, further comprising the step of generating the refresh request signal.

13. The refresh control method in the semiconductor memory device according to claim 11, further comprising the steps of:
    activating the refresh request signal until a predetermined number of refresh address signals has been generated.

* * * * *